(12) United States Patent
Dandu et al.

(10) Patent No.: US 10,498,296 B2
(45) Date of Patent: Dec. 3, 2019

(54) DIFFERENTIAL AMPLIFIER WITH VARIABLE NEUTRALIZATION

(71) Applicant: Texas Instruments Incorporated, Dallas, TX (US)

(72) Inventors: Krishnanshu Dandu, Allen, TX (US); Brian P. Ginsburg, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/704,314

(22) Filed: Sep. 14, 2017

(65) Prior Publication Data

US 2018/0269840 A1    Sep. 20, 2018

Related U.S. Application Data (60) Provisional application No. 62/473,639, filed on Mar. 20, 2017.

(51) Int. Cl.
| | | |
|---|---|---|
| *H03F 3/45* | (2006.01) | |
| *H03F 1/56* | (2006.01) | |
| *H03F 1/02* | (2006.01) | |
| *H03F 1/14* | (2006.01) | |

(52) U.S. Cl.
CPC ............ *H03F 1/56* (2013.01); *H03F 1/0205* (2013.01); *H03F 1/14* (2013.01); *H03F 3/4521* (2013.01); *H03F 3/45183* (2013.01); *H03F 3/45475* (2013.01); *H03F 3/45775* (2013.01); *H03F 2200/15* (2013.01); *H03F 2200/408* (2013.01); *H03F 2203/45291* (2013.01)

(58) Field of Classification Search
CPC .......................................................... H03F 3/45
USPC ......................................... 330/261, 253, 257
See application file for complete search history.

(56) References Cited

U.S. PATENT DOCUMENTS

| | | | | |
|---|---|---|---|---|
| 4,055,807 A | * | 10/1977 | Priniski | ................... H04B 1/48 |
| | | | | 455/78 |
| 4,536,717 A | * | 8/1985 | Hauge | .................. H03F 1/3211 |
| | | | | 330/254 |
| 4,692,712 A | | 9/1987 | Quinn | |
| 6,211,738 B1 | | 4/2001 | Hecht | |
| 6,952,134 B2 | * | 10/2005 | Burns | ..................... G05F 3/242 |
| | | | | 327/562 |
| 7,193,471 B2 | * | 3/2007 | Tsutsui | ................. H03G 3/3047 |
| | | | | 330/285 |
| 7,355,479 B2 | | 4/2008 | Van Der Heijden | |
| 7,425,865 B2 | | 9/2008 | Bromberger | |
| 7,688,158 B2 | * | 3/2010 | Rohani | .................... H03H 7/46 |
| | | | | 333/101 |

(Continued)

*Primary Examiner* — Henry Choe (74) *Attorney, Agent, or Firm* — Brian D. Graham; Charles A. Brill; Frank D. Cimino (57) ABSTRACT

Disclosed examples include differential amplifier circuits and variable neutralization circuits for providing an adjustable neutralization impedance between an amplifier input node and an amplifier output node, including neutralization impedance T circuits with first and second impedance elements in series between the amplifier input and output, and a third impedance element, including a first terminal connected to a node between the first and second impedance elements, and a second terminal connected to a transistor. The transistor operates according to a control signal to control the neutralization impedance between the amplifier input node and the amplifier output node.

21 Claims, 10 Drawing Sheets

(56) References Cited

U.S. PATENT DOCUMENTS

| | | | |
|---|---|---|---|
| 2005/0147136 A1* | 7/2005 | Pobanz | G02F 1/0121 |
| | | | 372/26 |
| 2005/0174175 A1* | 8/2005 | Heigelmayer | H03F 1/0205 |
| | | | 330/254 |
| 2006/0001492 A1* | 1/2006 | Chang | H03F 3/191 |
| | | | 330/306 |
| 2006/0284670 A1 | 12/2006 | Eid et al. | |
| 2007/0046376 A1 | 3/2007 | Van Der Heijden | |
| 2007/0057729 A1* | 3/2007 | Yamamoto | H03F 1/302 |
| | | | 330/285 |
| 2012/0019324 A1* | 1/2012 | Kumar | H03F 3/45179 |
| | | | 330/261 |
| 2012/0062286 A1 | 3/2012 | Ginsburg et al. | |
| 2016/0299215 A1 | 10/2016 | Dandu et al. | |
| 2017/0090015 A1 | 3/2017 | Breen et al. | |
| 2017/0139036 A1 | 5/2017 | Nayyar et al. | |

\* cited by examiner

DIFFERENTIAL AMPLIFIER WITH VARIABLE NEUTRALIZATION

REFERENCE TO RELATED APPLICATION

Under 35 U.S.C. § 119, this application claims priority to, and the benefit of, U.S. provisional patent application No. 62/473,639, entitled "A tunable gain common source differential amplifier with variable neutralization", and filed on Mar. 20, 2017, the entirety of which is hereby incorporated by reference.

BACKGROUND

Differential amplifiers are used in a variety of applications, including amplifying receive signals, distributing local clock on the chip and transmit signals in mm wave radar systems. Neutralization is sometimes used to enhance the gain of the differential amplifier transistors by providing positive feedback between input and output terminals. Capacitor neutralization involves connecting a neutralization capacitor between the amplifier output and the amplifier input to neutralize the gate to drain capacitance of the amplifier transistor. This connection is made in a cross-coupled manner with the positive drain terminal connected to the negative gate terminal and vice-versa. Many mm wave common source differential amplifier designs use neutralization to increase operating power gain of transistor and improve reverse isolation. Variations in fabrication processing, however lead to process spread, and the capacitance of the neutralization capacitors or the transistors can vary greatly. Amplifier designs that use process variable neutralization capacitors face gain and stability challenges across process. To ensure stability at one process extreme, amplifier gain has to be sacrificed at the other extreme. Amplifier gain performance can be adjusted or tuned to combat process gain and stability variation. For example, the gate bias of amplifier transistors can be varied. However, the full gain spread cannot always be recovered using gate bias adjustment since this technique does not counteract gain reduction due to overlap capacitance. Also, changing the bias of the device significantly impacts other RF parameters such as the noise figure and linearity of the device. Another approach uses varactors instead of fixed metal interconnect neutralization capacitors. However, varactors have a lower quality factor (Q) at mm wave frequencies compared to metal capacitors and this reduces the amplifier gain. Another approach uses shunt switches on the amplifier transistors to reduce the gain when the switches are engaged. This approach does not change the inherent gain of the amplifier stage, and the finite impedance shift due to the switch has to be taken into consideration while designing matching networks. Accordingly, improvements are needed to provide robust amplifier gain and stability performance across process variations.

SUMMARY

Disclosed examples include differential amplifier circuits and variable neutralization circuits to provide an adjustable neutralization impedance between an amplifier input node and an amplifier output node. The variable neutralization circuit includes a T circuit with first and second impedance elements in series between the amplifier input and output. A third impedance element includes a first terminal coupled with a node between the first and second impedance element, and a second terminal connected to ground. The third impedance element in certain examples is a capacitor such as a variable capacitor formed as a varactor or a fixed metal interconnect capacitor in series with a transistor acting as a switch. A control signal varies the impedance of the impedance element in the T path, thereby varying the neutralization impedance between the amplifier input node and the amplifier output node. In certain examples, the differential amplifier includes a common source differential pair circuit with first and second n-channel field effect transistors. In certain examples, the third impedance element is a MOS capacitor. A control circuit provides the control signal to operate the transistor. In certain examples, the control circuit provides two-state control to turn the transistor off to provide a first neutralization impedance value for high gain operation, or turns the transistor at least partially on to lower the neutralization impedance and the differential amplifier gain. In certain implementations, the control circuit includes fuse circuitry configurable during manufacturing to allow gain adjustment to compensate for process variations. In certain examples, a fuse circuit or digital to analog converter circuit (DAC) provides the control circuit allowing multi-bit control of the neutralization impedance and amplifier gain. In other examples, a sensor provides an output signal according to circuit temperature or other environmental condition of the differential amplifier circuit to directly or indirectly set the level of the control signal to adapt the neutralization impedance and amplifier gain during circuit operation.

DETAILED DESCRIPTION

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Figure 1:
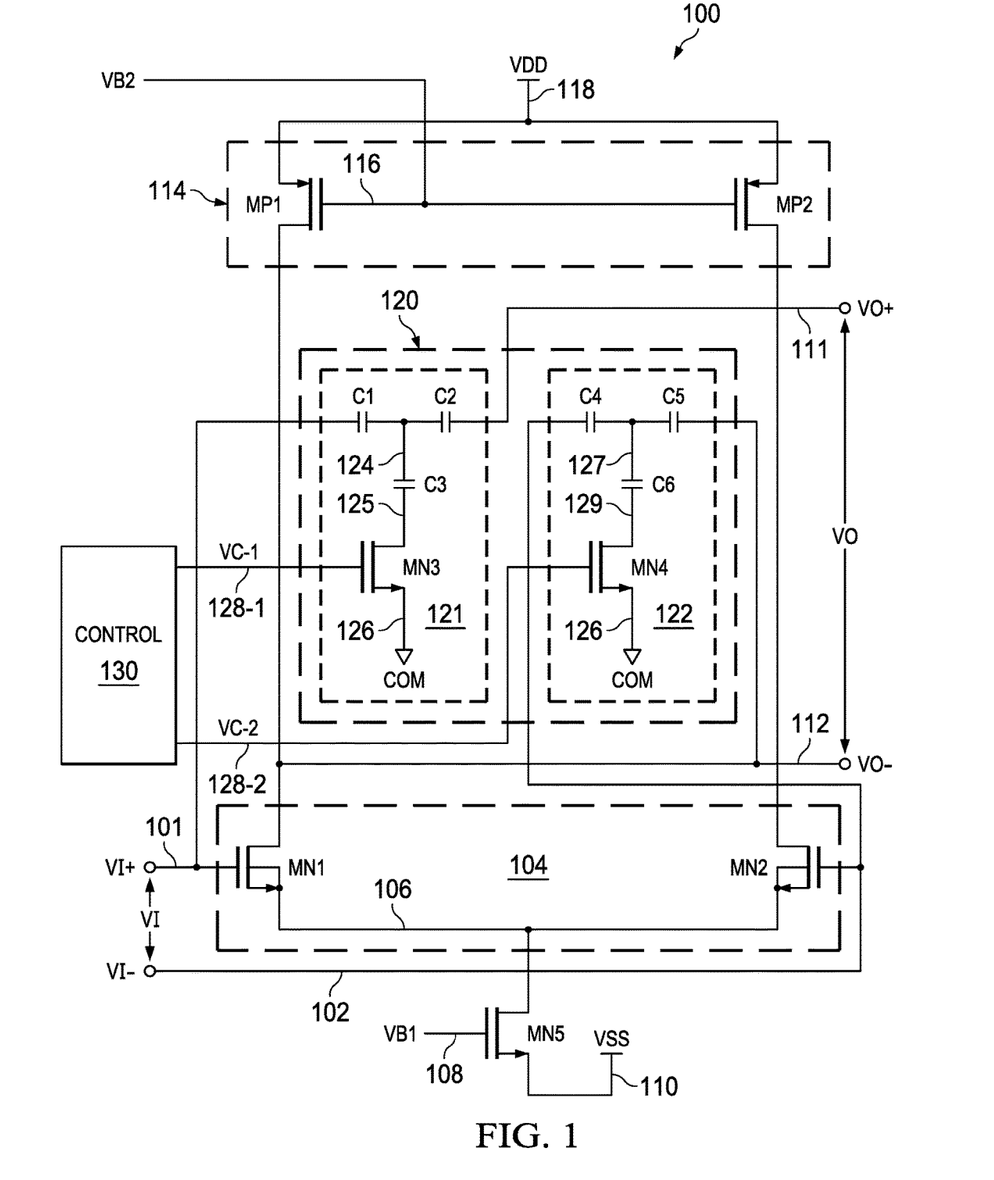
FIG. 1 is a schematic diagram of a differential amplifier with a variable neutralization circuit with a capacitive T circuit and a transistor switch to provide an adjustable neutralization capacitance between the amplifier input and output.

FIG. 1 shows a differential amplifier circuit 100 with a variable neutralization circuit 120 that provides adjustable neutralization impedance between the amplifier inputs and outputs. The example of FIG. 1 includes capacitor elements to provide variable neutralization capacitance, and illustrated examples are described hereinafter with respect to neutralization capacitor circuitry. In other implementations, variable neutralization circuits are provided including inductors, resistors or other forms of impedance elements, or combinations thereof, that provide adjustable neutralization impedance between the amplifier inputs and outputs. The differential amplifier circuit 100 can be used in a variety of applications, including low noise amplifiers in radar systems, driver amplifiers in a transmit chain etc. The circuit 100 includes a differential pair circuit 104 with transistors MN1 and MN2 configured in a common source topology to amplify a differential input signal VI and to deliver a differential output signal VO to a differential output. The differential input includes a first input node 101 connected to the gate control terminal of the first transistor MN1 with a voltage labeled VI+. A second input node 102 is connected to the gate control terminal of the second transistor MN2 and has a voltage labeled VI−. The differential output includes a first output node 111 with a voltage VO+ and a second output node 112 with a voltage VO−. The differential pair circuit 104 in one example includes n-channel field effect transistors MN1 and MN2, although bipolar transistors can be used in other examples. In other examples, p-channel field effect transistors can be used. In addition, the illustrated example is a common-source configuration with the source terminals of MN1 and MN2 connected to one another at a common source node 106. The drain of MN1 is connected to the second output node 112, and the drain of MN2 is connected to the first output node 111.

The circuit 100 also include a first bias circuit coupled with the differential pair circuit 104 to control a voltage of the common source node 106, and a second bias circuit 114 coupled to control the drain currents of MN1 and MN2. Any suitable bias circuitry can be used in various examples. In FIG. 1, the first bias circuit includes an n-channel transistor MN5 with a drain connected to the common source node 106 and a source connected to a negative supply voltage node 110 with a voltage VSS. The gate control terminal 108 of the transistor MN5 is controlled by a first bias voltage signal VB1 to set the voltage of the common source node 106. The second bias circuit 114 includes first and second p-channel transistors MP1 and MP2 with sources connected to a positive supply node 118 having a supply voltage VDD, and gate control terminals 116 connected to a second bias voltage signal VB2. The drain of the upper bias transistor MP1 is connected to the drain of the first differential pair transistor MN1 at the second output node 112, and the drain of MP2 is connected to the drain of MN2 at the first output node 111.

The variable neutralization circuit 120 includes first and second neutralization capacitor circuits 121 and 122 that operate to neutralize the gate-drain capacitance of the differential pair transistors MN1 and MN2. The individual circuits 121 and 122 are T circuits with three capacitor elements. In the example of FIG. 1, the individual circuits 121 and 122 also include a switch, for example, an n-channel transistor. The first neutralization circuit 121 includes series circuit connected between the first input node 101 and the first output node 111. The series circuit includes a first capacitor C1 connected between the first input node 101 and a first internal node 124, as well as a second capacitor C2 connected between the first internal node 124 and the first output node 111. In addition, the first neutralization circuit 121 includes a third capacitor C3 coupled in series with a third transistor MN3 between the first internal node 124 and a reference node 126. The reference node 126 can be any reference voltage, such as a circuit ground or common connection (e.g., COM). In the illustrated example, the capacitor C3 includes a first terminal connected to the first internal node 124, and a second terminal 125 connected to the drain of the third transistor MN3. The source of MN3 is connected to the reference node 126. In an alternate implementation, the transistor MN3 is connected between the third capacitor C3 and the node 124. When the transistor MN3 is turned off, the capacitor C3 does not affect the capacitance between the first input node 101 and the first output node 111, and the neutralization capacitance is controlled entirely by the series combination of C1 and C2. When the transistor MN3 is turned on (fully or at least partially), connection of C3 between the node 124 and the reference node 126 reduces the neutralization capacitance between the input node 101 and the output node 111. In one example, C1 and C2 have identical capacitances C, and C3 has a capacitance of 2C, although not a strict requirement of all possible implementations.

The second neutralization capacitor circuit 122 includes a fourth capacitor C4 connected between the second input node 102 and a second internal node 127, as well as a fifth capacitor C5 connected between the second internal node 127 and the second output node 112. The T circuit 122 also includes a sixth capacitor C6 coupled in series with a fourth transistor MN4 between the second internal node 127 and the reference node 126. In the illustrated example, C6 includes a first terminal connected to the second internal node 127 and a second terminal 129 connected to the drain of MN4, and the source of MN4 is connected to the reference node 126. In another possible implementation, C6 is connected to the reference node 126, and MN4 is connected between the C6 and the node 127. In one example, C4 and C5 are of equal capacitances C, and the capacitance of C6 is 2C, although any suitable capacitance values can be used for C4-C6. When MN4 is turned off, C6 does not affect the capacitance between the input and output nodes 102, 112, and the neutralization capacitance is controlled entirely by the series combination of C4 and C5. When MN4 is fully or at least partially turned on, C6 is connected between the node 127 and the reference node 126, and reduces the neutralization capacitance between the second input node 102 and the second output node 112. In the illustrated example MN3 and MN4 are n-channel field effect transistors with gates 128-1 and 128-2 to receive the control signals VC-1 and VC-2, respectively.

A control circuit 130 provides first and second control signals VC-1 and VC-2 to operate the neutralization adjustment transistors MN3 and MN4. The control circuit 130 has a first output connected to provide the first control signal VC1 to the gate or control terminal 128-1 of MN3. The control circuit 130 controls the first neutralization capacitance between the first input node 101 and the first output node 111 by controlling the voltage level of the control signal VC-1. The control circuit 130 in this example has a second output connected to provide the second control signal VC-2 to the gate or control terminal 128-2 of the fourth transistor MN4. The voltage level of the second first control signal VC-2 controls the second neutralization capacitance between the second input node 102 and the second output node 112. In one example, the series connected capacitors C1, C2, C4 and C5 are high Q capacitors fabricated using metal capacitor plate structures, such as copper or other metal structures in IC metallization layers with oxide or other dielectric material therebetween. In certain examples, the T branch capacitors C3, C6 can also be high Q capacitors formed in the IC metallization layers. In other examples (e.g., FIG. 4 below), the T branch capacitors C3 and/or C6 are MOS capacitors. The capacitor quality or Q factor represents the ratio of the capacitor reactance to the capacitor resistance at a given frequency according to $Q=X_C/R_C=1/\omega CR_C$, where $\omega$ is the frequency, C is the capacitance, $X_C$ is the capacitive reactance, and $R_C$ is the series resistance of the capacitor. Higher Q factors represent higher efficiency where the structure approaches the behavior of an ideal, lossless, capacitor.

In one example, the control circuit 130 provides the control signals VC-1 and VC-2 in one of two possible states (e.g., single bit binary control), including a first state to turn the third and fourth transistors MN3, MN4 off to set the first and second neutralization capacitances to a first capacitance value. In this example, the control circuit 130 is also configured to alternatively provide the signals VC-1 and VC-2 in a second state to turn MN3 and MN4 at least partially on in order to set the neutralization capacitances to a second capacitance value lower than the first capacitance value. In certain examples, the control circuit 130 provides the first and second control signals VC-1 and VC-2 at the same voltage levels to control the first and second neutralization capacitor circuits 121 and 122 in similar fashion to provide substantially equal first and second neutralization capacitances in the circuit 100, although not a strict requirement of all possible implementations. In certain examples, the control circuit 130 provides a single control signal to both the control terminals 128-1 and 128-2. In other examples, the control circuit 130 implements multibit control to provide the control signals VC-1 and VC-2 in one of three or more possible states. In certain implementations, the control circuit 130 is configured during manufacturing to set the neutralization capacitance to one of two or more possible values, for instance, based on process variations for a particular integrated circuit (IC) that includes the differential amplifier circuit 100. In other implementations, the control circuit 130 is configured to adjust the neutralization capacitances, and thus the amplifier gain, based on one or more environmental conditions of a host IC, for example, sensed temperature as discussed below in connection with FIG. 18. In other possible implementations, the control circuit 130 provides the control signal or signals VC-1 and VC-2 as an analog signal based on a sensor signal, either directly, or based on an analog signal provided to an analog-to-digital converter (ADC) that provides a corresponding digital signal to control a digital-to-analog converter circuit to provide the neutralization transistor gate control signal (e.g., FIG. 18 below).

Figure 2:
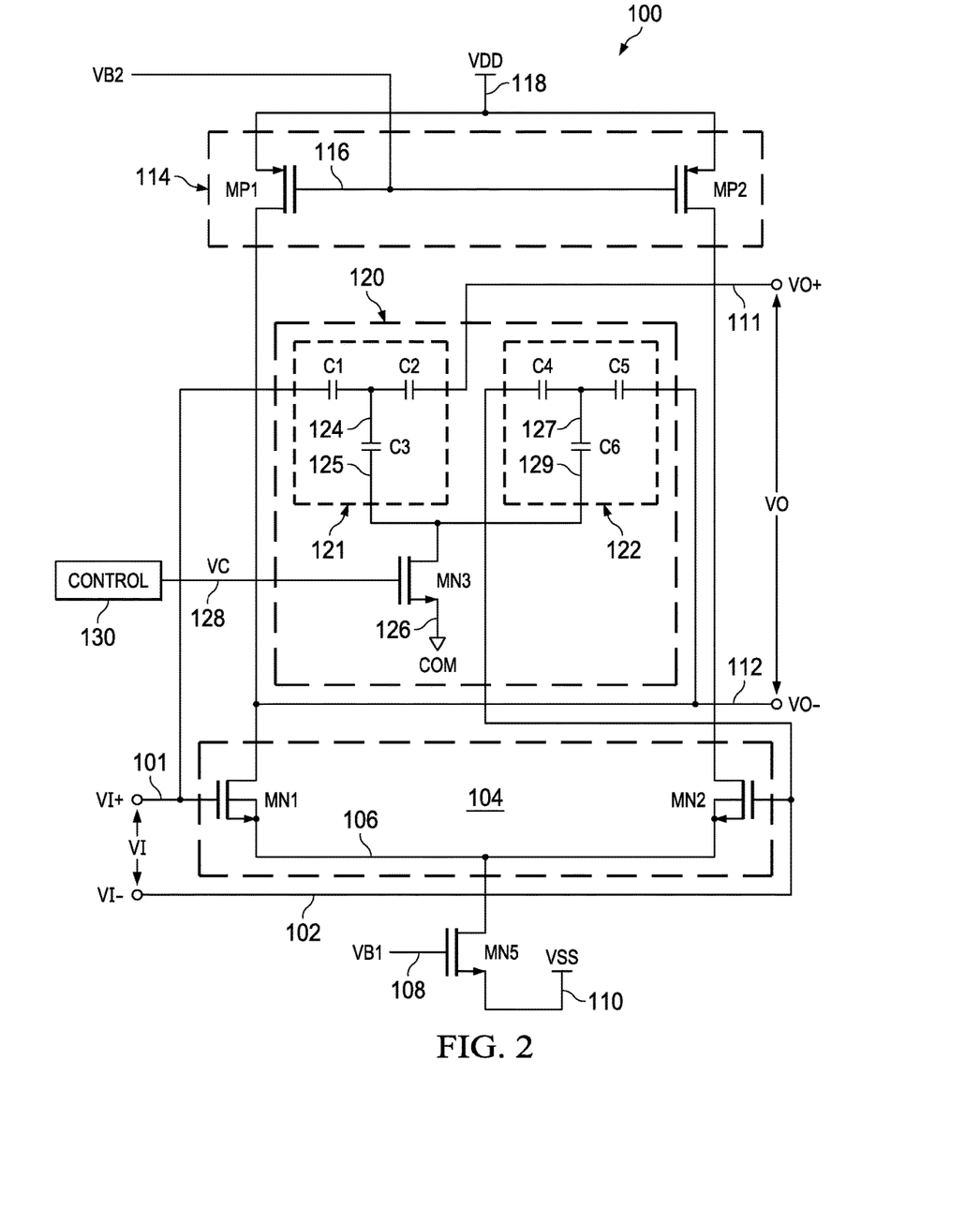
FIG. 2 is a schematic diagram of a differential amplifier with another example variable neutralization circuit.

Referring now to FIGS. 2 and 3, FIG. 2 shows a differential amplifier circuit 100 generally as described above, including another example variable neutralization circuit 120. The amplifier 100 in FIG. 2 provides first and second neutralization capacitor circuits 121 and 122 with capacitors C1-C6 connected in T circuits as described above. In this example, the drain of a single shared neutralization circuit transistor MN3 is connected to the second terminal 125 of the third capacitor C3 and to the second terminal 129 of C6. The source of the transistor MN3 is connected to the reference node 126 (COM) and the gate control terminal 128 of MN3 is connected to a single output of the control circuit 130 to receive a voltage control signal VC. In the off state of MN3, the capacitances of the circuits 121 and 122 are determined solely by the series combinations of C1, C2 and C4, C5, respectively. When MN3 is turned at least partially on by the control signal VC, the individual T capacitors C3 and C6 are connected between the internal nodes 124, 127 and the reference node 106 to selectively reduce the neutralization capacitances to reduce the amplifier gain. In the example of FIG. 2, the third transistor MN3 is an n-channel field effect transistor, with a drain connected to the second terminals 125, 129 of the third and sixth capacitors C3, C6, a source connected to a reference node 126. Other interconnections are possible using n or p-channel FETs or bipolar transistors for a single shared neutralization transistor MN3. The control circuit 130 operates as described above to provide single bit, multibit or analog control to selectively set the neutralization capacitances of the circuits 121 and 122 using the single control signal VC.

Figure 3:
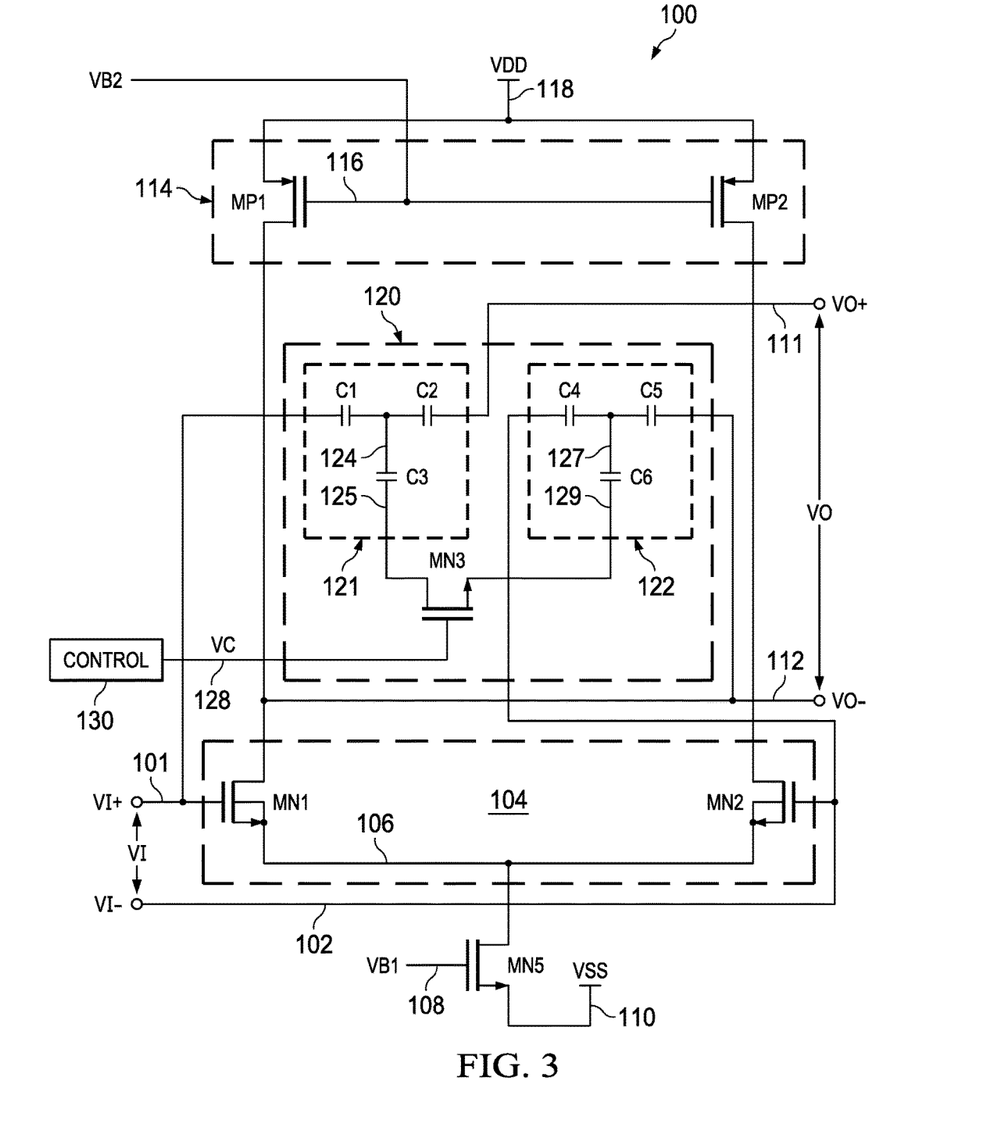
FIG. 3 is a schematic diagram of a differential amplifier with yet another example variable neutralization circuit.

FIG. 3 shows a differential amplifier circuit implementation 100 that includes another example variable neutralization circuit 120 using a single shared neutralization transistor MN3. The differential amplifier circuit 100 is configured generally as described above, including neutralization capacitor circuits 121 and 122 with capacitors C1-C6 connected in T circuits. In this example, the drain of a single shared neutralization circuit transistor MN3 is connected to the second terminal 125 of C3 and the source is connected to the second terminal 129 of C6. As in the above examples, when MN3 is turned off, C1, C2 and C4, C5 set the neutralization capacitances of the circuits 121 and 122. When the control circuit 130 turns MN3 on via the control signal VC, the T branch capacitors C3 and C6 are connected and the neutralization capacitances are reduced. In other examples, the drain and source connections of MN3 can be reversed. In this example, for capacitors C1, C2, C4 and C5 of equal capacitance C, and capacitors C3 and C6 of capacitance C1, the off-state neutralization capacitance for each of the circuits 121, 122 is $C_2$, and the effective neutralization capacitance $C_{EFF}$ when MN3 is fully on with an ideal zero drain-source on resistance RDSON is given by $C_{EFF}=C_1^2/(2C_1, +C_2)$. In one non-limiting implementation, $C_1=36$ fF and $C_2=72$ fF, although any suitable values can be used. The example of FIG. 3 uses an n-channel FET MN3. Other examples can use a p-channel FET or bipolar transistor to control the adjustable neutralization circuits 121 and 122.

Figure 4:
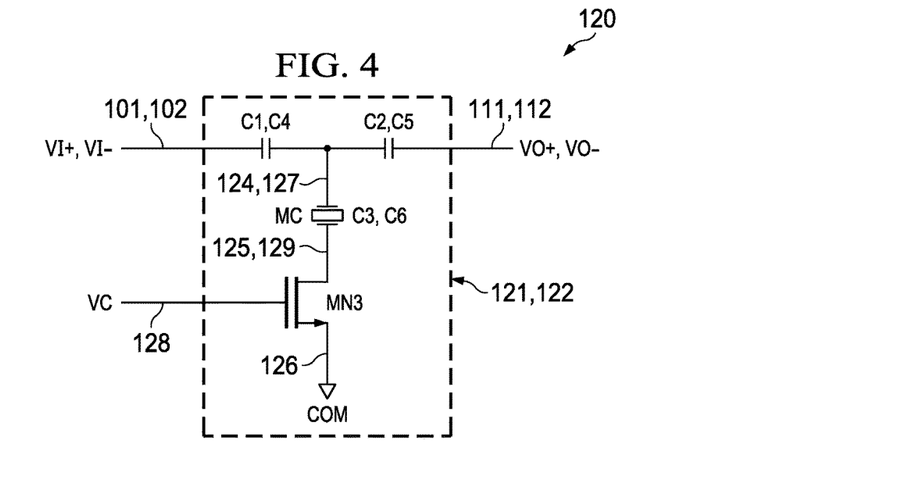
FIG. 4 is a schematic diagram of an example neutralization circuit with a MOS capacitor.

FIG. 4 shows an alternate example neutralization circuit which can be used for either or both of the circuits 121, 122. In this example, the third and/or sixth capacitors C3, C6 are MOS capacitors or varactors MC in the T branch between the corresponding internal node 124, 127 and the neutralization transistor MN3. In certain examples, mentioned C1, C2, C4 and C5 are high Q capacitors fabricated using metal capacitor plate structures formed in IC metallization layers with oxide or other dielectric material therebetween.

Figure 5:
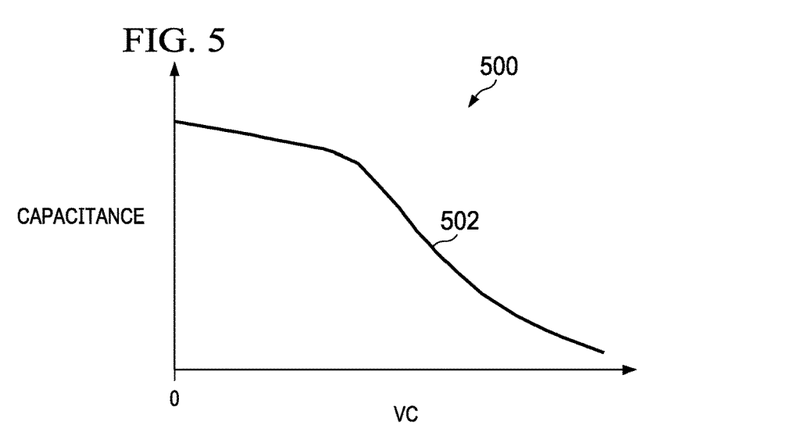
FIG. 5 is a graph showing neutralization capacitance as a function of transistor switch gate control voltage.
Figure 6:
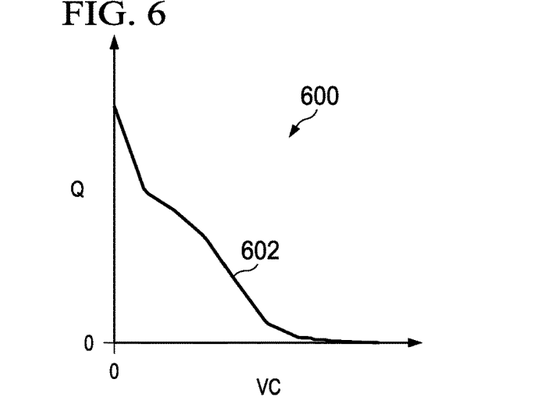
FIG. 6 is a graph showing neutralization capacitor quality or Q factor as a function of transistor switch gate control voltage.

Referring now to FIGS. 5 and 6, a graph 500 in FIG. 5 shows a neutralization capacitance curve 502 as a function of the voltage control signal VC. The curve 502 is one example of the neutralization capacitance between the amplifier input and the amplifier output (e.g., the capacitance between the first input node 101 and the first output node 111 in the amplifier circuit 100 above). In the above examples, the control circuit 130 provides the control signal or signals VC, VC-1 and/or VC-2 in order to control the corresponding neutralization circuit transistor or transistors MN3, MN4 to selectively set the neutralization capacitance between the differential amplifier input and output nodes. As shown in the curve 502 of FIG. 5, the neutralization capacitance decreases with increasing gate control voltage applied to the transistor MN3. A graph 600 in FIG. 6 shows a Q factor curve 602 illustrating the quality of the neutralization capacitance as a function of the voltage control signal VC. As seen in FIG. 6, the Q factor decreases with increasing control voltage applied to the transistor control terminal. In the illustrated examples, the control circuit 130 sets the level or voltage amplitude of the control signal or signals VC to set the neutralization capacitance 502 at the corresponding neutralization capacitor Q factor 602. In one implementation, the control circuit 130 turns off the transistor MN3 (and MN4 in the example of FIG. 1) in a first state to provide a nominal neutralization capacitance determined according to the series combination of the capacitors C1, C2 and C4, C5, for instance, by applying a 0.0 V control signal VC. This corresponds to the maximum neutralization capacitance 502 and the maximum Q factor 602. In addition, this state corresponds to the maximum differential amplifier gain.

The control circuit 130 is configured during manufacturing in one example to provide a different control voltage amplitude VC that is greater than 0.0 V if trimming or adjustment in the differential amplifier gain is desired. For example, the control circuit 130 in one example provides a non-zero control signal VC for a given integrated circuit product when manufacturing testing indicates that the process corner is nominal or strong. This adjustment effectively reduces the differential amplifier gain and the Q factor to compensate for process variations. In this non-limiting example, the control circuit 130 provides a zero or low amplitude control signal VC for a strong process to provide a nominal (e.g., maximal) differential amplifier gain and Q factor. FIGS. 10-15 below illustrate process-based effects of the neutralization capacitance on differential amplifier gain and stability. The control circuit 130 can implement a variety of different control signal generation circuitry and techniques (e.g., FIGS. 16-18 below) in order to set the neutralization capacitance to adapt a particular fabricated integrated circuit to processing conditions during manufacturing of the differential amplifier circuit 130.

Figure 7:
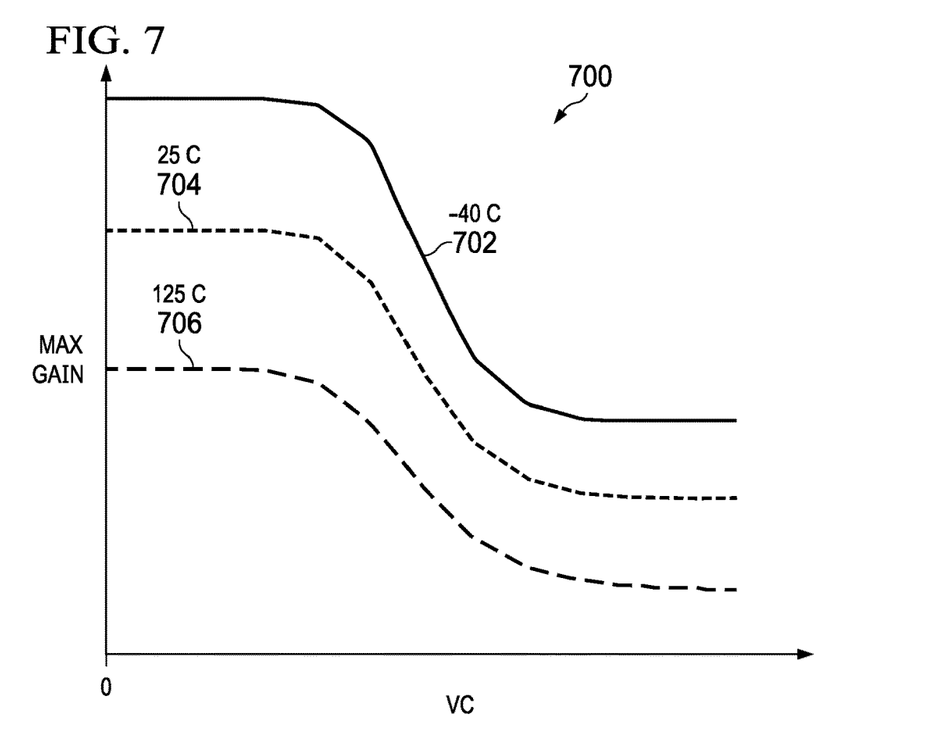
FIG. 7 is a graph showing temperature dependence of differential amplifier maximum gain as a function of neutralization circuit transistor switch gate control voltage.

Referring also to FIGS. 7-9, a graph 700 in FIG. 7 illustrates differential amplifier maximum gain curves 702, 704 and 706 as a function of neutralization circuit transistor gate control voltage VC. The curve 702 corresponds to differential amplifier gain at −40° C., the curve 704 illustrates operation at 25° C. and the curve 706 shows differential amplifier gain at 125° C. in one example implementation of the amplifier circuit 100. The control circuit 130 in other examples is operated according to a sensed operating condition (e.g., temperature) associated with a host IC to dynamically adjust the neutralization capacitance, and hence the differential amplifier gain and Q factor during operation of the amplifier circuit 100. As seen in FIG. 7, the differential amplifier gain at a given temperature decreases with increasing transistor control voltage VC, and the transistor gain for a given control voltage setting VC decreases with increasing temperature. In one possible implementation, the control circuit 130 is set to turn the neutralization control transistors MN3 and MN4 completely off when the circuit 100 is operated at high temperatures, and to turn the transistors MN3 and MN4 at least partially on for lower temperature operation. This can be done, for example, according to a thermal sensor providing a signal indicating the circuit operating temperature, and controlling the amplitude or voltage level of the control signal VC based on the sensor signal. In another implementation, the control circuit 130 is configured during manufacturing to provide the control signal or signals VC based on an intended use of a given manufactured IC. In addition, the control voltage setting provided by the control circuit 130 can be configured during manufacturing in consideration of both environmental operating conditions (e.g., temperature) and/or process variations in order to achieve a desired differential amplifier operation with respect to gain, stability, Q factor, bandwidth and/or other operating parameters for a given application.

Figure 8:
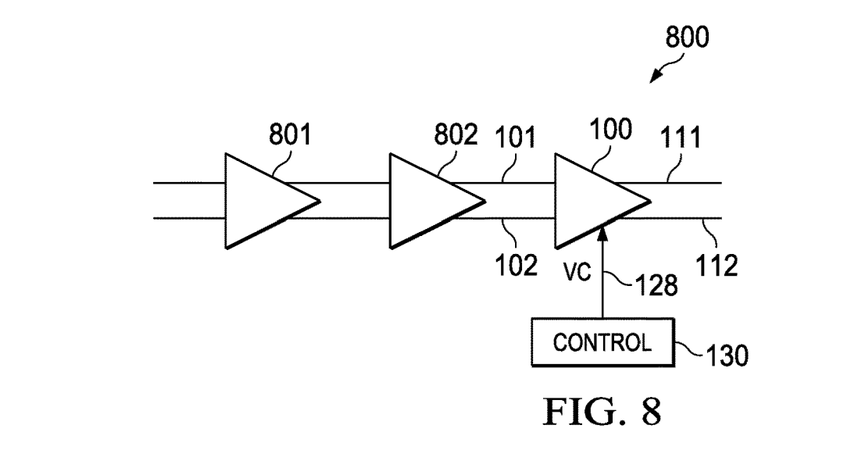
FIG. 8 is a schematic diagram showing an example 3 stage differential amplifier circuit including a final third stage with a variable neutralization circuit.
Figure 9:
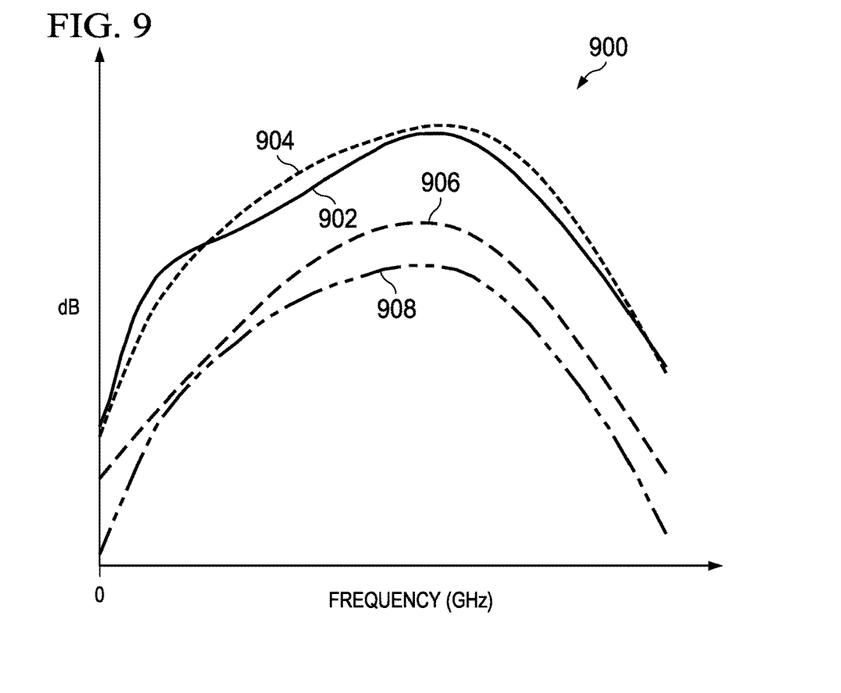
FIG. 9 is a graph showing differential amplifier gain as a function of frequency for various neutralization examples at different temperatures in the three stage circuit of FIG. 8

FIG. 8 shows an example 3 stage differential amplifier circuit 800 including a first stage 801, a second stage 802, and a third stage 100. The third stage C includes first and second input nodes 101 and 102, as well as outputs 111 and 112, and a variable neutralization circuit operated according to a control signal VC from the control circuit 130 as described above (e.g., FIGS. 1-3). In one example, the 3 stage configuration 800 is used to implement a low noise amplifier (LNA) to process receiver antenna signals in a radar system. A graph 900 in FIG. 9 shows curves 902, 904, 906 and 908 representing differential amplifier gain in the three stage circuit 800 of FIG. 8 as a function of frequency for various neutralization examples at different temperatures. The gain initially increases with increasing frequency until a maximum is reached, for example, approximately 77-80 GHz, and further frequency increase results in lowered differential amplifier gain. The curve 902 illustrates a differential amplifier with fixed neutralization operating at 25° C., and the curve 904 shows operation of the circuit 800 with variable neutralization at 25° C. with the control signal voltage VC at 0.0 V. The curve 906 in FIG. 9 illustrates operation of the circuit 800 at 25° C. for a control signal voltage VC of 1.0 V. As shown in FIG. 9, turning on the transistor MN3 (e.g., and any included transistor MN4) reduces the differential amplifier gain across the illustrated frequency range. For example, a gate reduction of approximately three dB is achieved at the peak gain around 77 GHz. The curve 908 in FIG. 9 illustrates operation of the circuit 800 with variable neutralization via the circuits 121 and 122 with the control signal voltage VC at 0.0 V for operation at 125° C. The comparing the curves 904 and 908, FIG. 9 further demonstrates the decrease in differential amplifier gain with increasing temperature.

Figure 10:
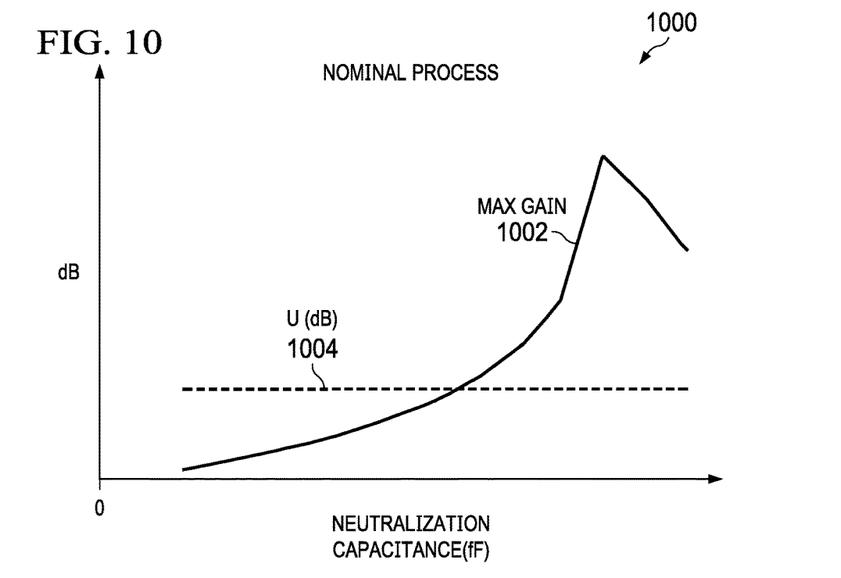
FIG. 10 is a graph showing gain as a function of neutralization capacitance for a nominal fabrication process.
Figure 11:
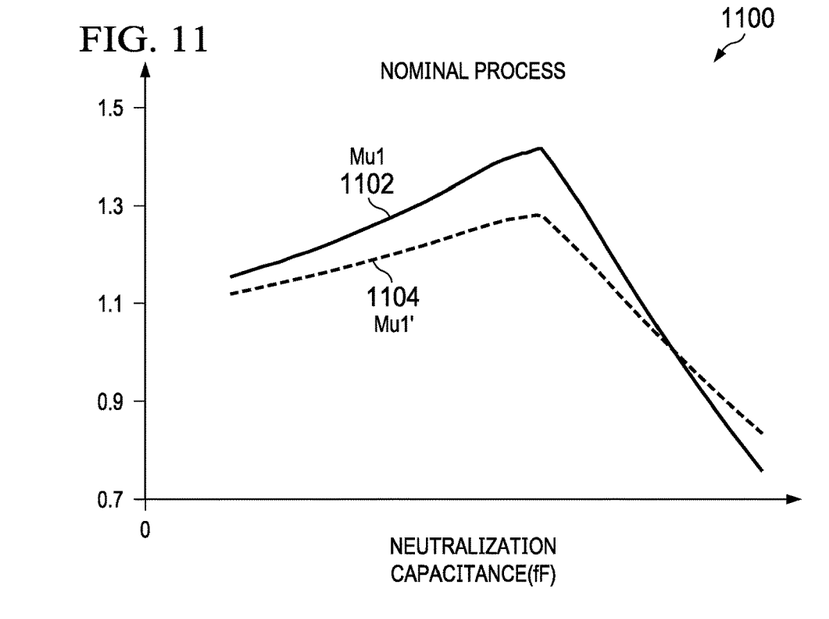
FIG. 11 is a graph showing stability factors Mu1 and Mu1' as a function of neutralization capacitance for the nominal fabrication process.
Figure 12:
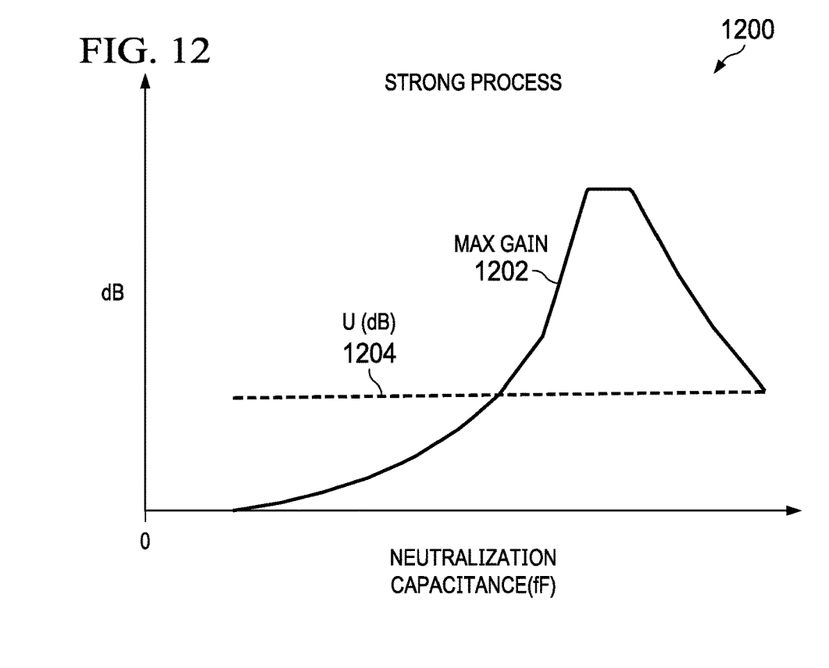
FIG. 12 is a graph showing gain as a function of neutralization capacitance for a strong fabrication process.
Figure 13:
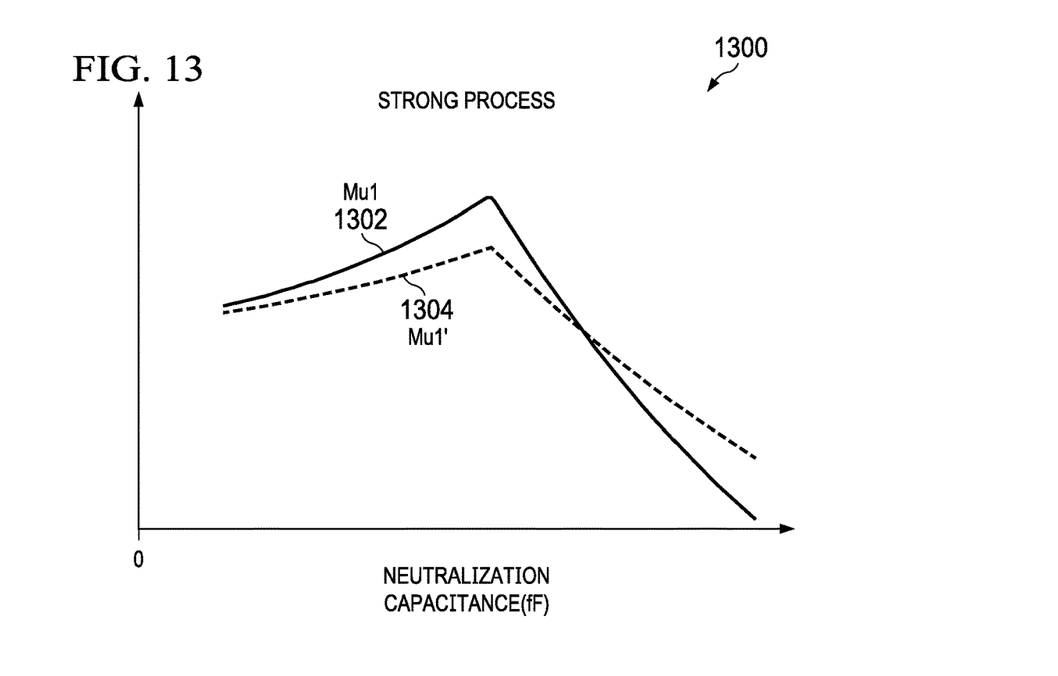
FIG. 13 is a graph showing stability factors Mu1 and Mu1' as a function of neutralization capacitance for the strong fabrication process.
Figure 14:
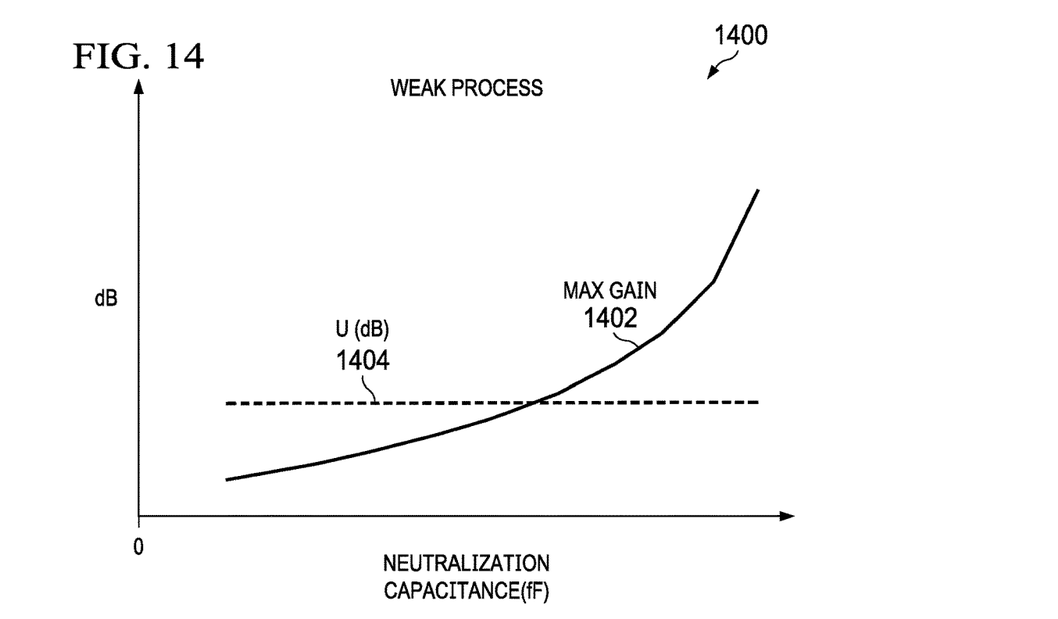
FIG. 14 is a graph showing gain as a function of neutralization capacitance for a weak fabrication process.
Figure 15:
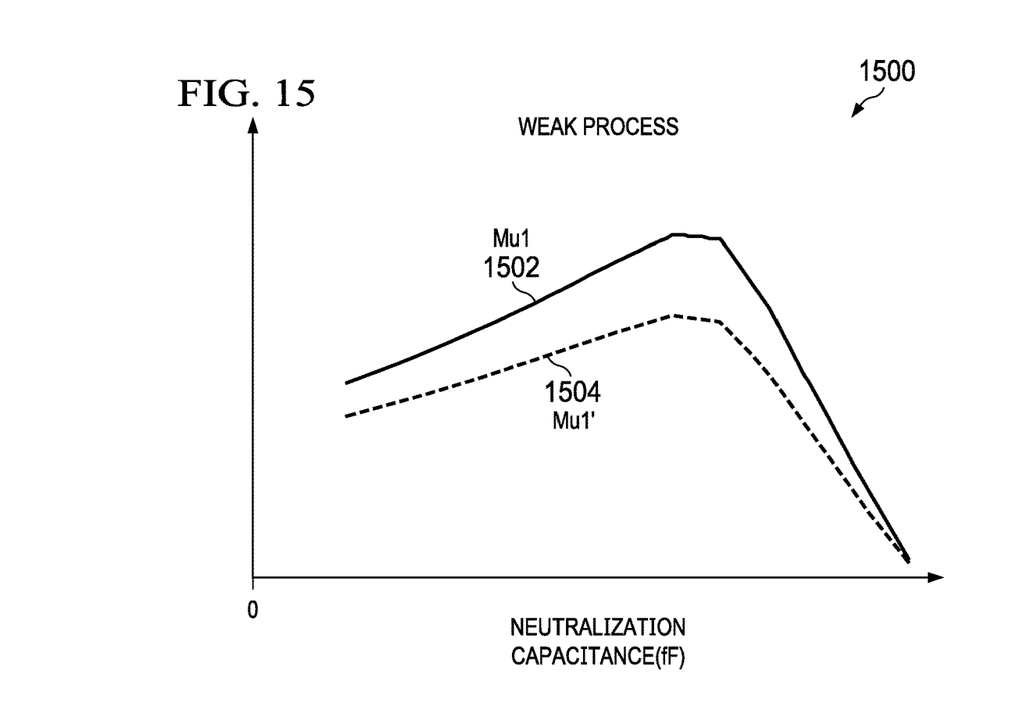
FIG. 15 is a graph showing stability factors Mu1 and Mu1' as a function of neutralization capacitance for the weak fabrication process.

FIGS. 10-15 show examples process-based effects of the neutralization capacitance on differential amplifier gain and stability. A graph 1000 in FIG. 10 shows the maximum differential amplifier gain (curve 1002) and stability factor U (curve 1004) as a function of neutralization capacitance for a nominal fabrication process. A graph 1100 in FIG. 11 illustrates curves 1102 and 1104 respectively representing stability factors Mu1 (curve 1102) and Mu1' (curve 1104) as a function of neutralization capacitance for the nominal fabrication process. FIGS. 12 and 13 provide comparable graphs 1200 and 1300 for a strong fabrication process, and FIGS. 14 and 15 provide graphs 1400 and 1500 for a week fabrication process. For the strong process, the graph 1200 in FIG. 12 includes a curve 1202 representing the maximum differential amplifier gain and a curve 1204 showing the stability factor U as a function of neutralization capacitance. The graph 1300 in FIG. 13 shows Mu1 and Mu1' curves 1302 and 1304. For the week process, the graph 1400 in FIG. 14 includes a curve 1402 representing the maximum differential amplifier gain and a curve 1404 showing the stability factor U as a function of neutralization capacitance, and the graph 1500 in FIG. 15 shows Mu1 and Mu1' curves 1502 and 1504 as a function of neutralization capacitance.

As shown in FIGS. 10-15, the variation of processing conditions during integrated circuit manufacturing lead to variance in the effect of the neutralization capacitance on amplifier gain and stability. As previously mentioned, the control circuit 130 in one example implements single bit control of the neutralization capacitance by providing the control signal or signals VC in one of two possible states. In one implementation, on-chip or on-wafer test circuits can be used to determine whether a particular manufacturing process has a nominal, strong or weak process corner. Based on this assessment of the fabrication process corner condition, the control circuit 130 is configured to provide the neutralization control signal VC to facilitate reliable differential amplifier gain performance as well as stability. Differential amplifier stability is facilitated by unity or higher Mu1 and Mu1' values (curves 1102, 1104, 1302, 1304, 1502 and 1504). At the same time, amplifier gain generally increases with neutralization capacitance until a peak, and then decreases with further increases to neutralization capacitance (curves 1002, 1202 and 1402). Accordingly, for a given design and process corner, an intelligent selection of neutralization capacitance can be found. In one simple implementation, the neutralization capacitors C1, C2, C4 and C5 are selected to provide a neutralization the capacitance value that achieves the desired gain and amplifier stability for the week process (FIGS. 14 and 15), and the control circuit 130 is configured to provide the control signal or signals VC to turn off the transistor or transistors MN3, MN4 if a particular manufacturing process is determined to have a week process corner. Otherwise, for detected nominal or strong process corners, the control circuit 130 is configured during manufacturing to provide a non-zero control signal VC to at least partially turn on MN3 (and any included MN4). The value of the shunt capacitors C3 and C6 can be selected along with the second state voltage control signal VC and the shunt transistor RDSON to achieve a suitable second state effective capacitance to implement a desired amount of adjustment to the differential amplifier gain while maintaining adequate stability and Q factor. These benefits are also provided in multi-bit adjustment implementations. In this manner, the control circuit 130 and the variable neutralization circuitry 120 can be used to compensate manufacturing process variations to facilitate stable differential amplifier operation with acceptable gain.

Figure 16:
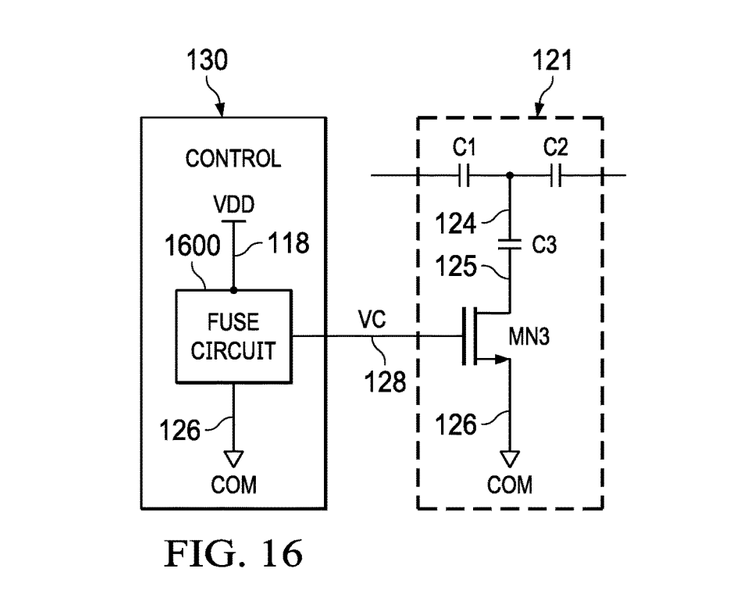
FIG. 16 is a schematic diagram showing an example control circuit with fuse circuitry to provide a transistor gate control signal to the neutralization circuit.
Figure 17:
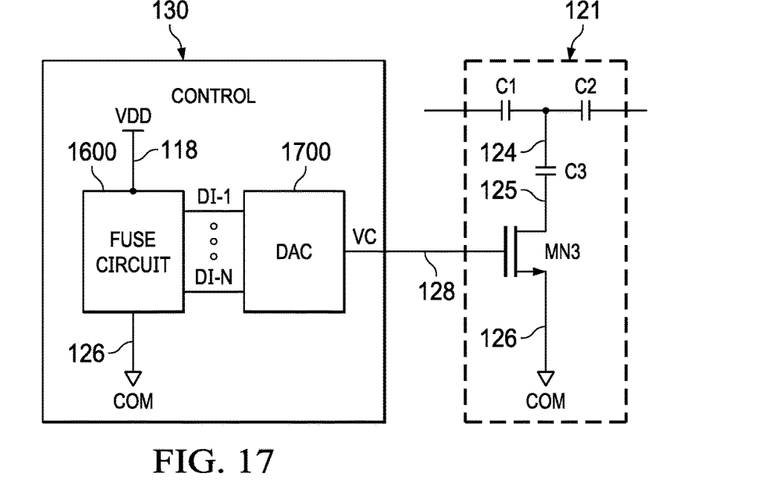
FIG. 17 is a schematic diagram showing another example control circuit including a fuse circuit and a digital-to-analog converter circuit to provide the neutralization transistor gate control signal.
Figure 18:
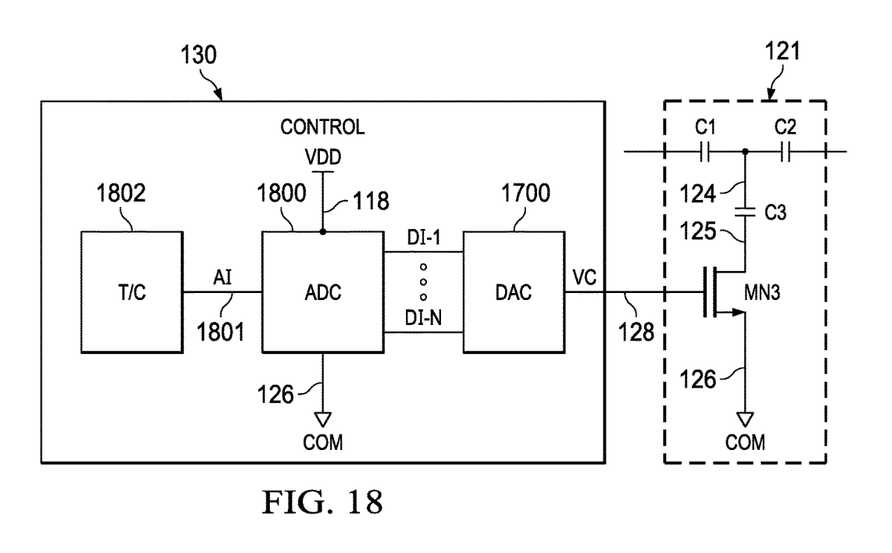
FIG. 18 is a schematic diagram showing another example control circuit including a thermocouple temperature sensor providing an analog signal to an analog-to-digital converter which generates a digital signal to control a digital-to-analog converter circuit to provide the neutralization transistor gate control signal.

Referring now to FIGS. 16-18, various implementations of the control circuit 130 include different control signal generation circuitry and implement various techniques to set the neutralization capacitance. The control circuit 130 can be configured in one example during manufacturing, or can be adapted during real-time operation of the differential amplifier circuit 130 to adapt a particular fabricated integrated circuit to processing conditions during manufacturing of the differential amplifier circuit 100 and/or according to environmental operating conditions of a host IC. FIGS. 16-18 show several non-limiting example control circuits 130 that provide a control signal VC to the first neutralization capacitor circuit 121. Although illustrated in association with a single circuit 121, the control circuit 130 in practice can include multiple individual circuits and associated outputs to provide multiple control signals (e.g., VC-1, VC-2 in FIG. 1 above) to configure multiple neutralization capacitor circuits 121 and 122.

FIG. 16 shows an example of the control circuit 130 including a fuse circuit 1600 that can be configured during integrated circuit manufacturing. The fuse circuit 1600 includes an output connected to the gate control terminal 128 of the lowercase and -channel neutralization control transistor MN3. The fuse circuit 1600 in one example selectively connects the gate control terminal 128 to either a positive supply voltage node 118 (VDD) or to a common or ground reference node 126 (COM). In this manner, the control circuit 130 blows an appropriate fuse to either turn the transistor MN3 fully off or to turn MN3 fully on. In other examples, the fuse circuit 1600 can include a resistive voltage divider circuit and a plurality of fuses to selectively connect the gate control terminal 128 to a voltage of either of the nodes 118 or 126 or to a voltage in between VDD and COM.

FIG. 17 shows another example control circuit 130 that includes a fuse circuit 1600 and a digital-to-analog converter (DAC or D/A) circuit 1700 to provide the neutralization transistor gate control signal VC to MN3. The fuse circuit 1600 in this example has multiple outputs to provide a multi-bit digital input signal DI-1, . . . , DI-N where N is an integer greater than 1. Each output line is connected by two internal fuses to the nodes 118 and 126, and the circuit 130 is configured by blowing one of the fuses for each output line, to leave each individual output connected to one of the nodes 118 or 126 (VDD or COM). The DAC circuit 1700 receives the multi-bit digital input signal DI-1, . . . , DI-N and includes an output that provides a single analog control signal VC to the gate control terminal 128 of the neutralization transistor MN3. The circuit 130 in FIG. 17 thus implements multi-bit control of the control signal VC and thus provides fuse configurable multi-bit adjustment of the neutralization capacitance and hence the differential amplifier gain. As previously discussed, this adjustability allows compensation for process variations in manufacturing and/ or for expected operating temperature.

FIG. 18 shows another example control circuit 130, which includes an analog-to-digital converter (ADC or A/D) 1800. The ADC 1800 includes an input 1801 that receives an analog input signal AI, and a multi-bit output that generates a corresponding multi-bit digital signal DI-1, . . . , DI-N. A DAC 1700 receives the digital signal DI-1, . . . , DI-N and provides a corresponding analog control signal VC to control the neutralization transistor MN3. The analog input signal AI can be provided by any suitable source for real-time neutralization capacitance adjustment. In the example of FIG. 18, a thermocouple temperature sensor 1802 provides the analog signal AI at the ADC input 1801. Other types of thermal sensor can be used, such as RTDs. In other implementations, other sensors can be used to sense an environmental condition of the differential amplifier circuit 100 and provide the analog signal AI to the input 1801 of the ADC 1800.

Disclosed examples provide neutralization capacitance tunability while allowing careful tradeoff between quality factor, gain and differential amplifier stability for use in low noise amplifiers for mm wave radar systems and other amplifier applications. Adjustment of a tunable capacitor element in the shunt path of the T circuits 121, 122 facilitates reversal of the direction of capacitance versus Q factor tradeoff compared to direct implementations using varactors. In particular, the circuits 120 and 130 provide solutions that achieve high Q factor in combination with high neutralization capacitance and high gain in the transistor off state, in combination with compensation of excess gain spread of CMOS mm wave amplifiers across process and temperature. Moreover, the tuning circuitry 120, 130 can be provided with minimal circuit size increase. Certain implementations have a T circuit with a MOS capacitor or varactor in the shunt path instead of a switched capacitor, with or without a switching transistor. The metal capacitors C1, C2, C4 and C5 in the series path of the T circuits 121, 122 facilitate high Q operation, the lower quality factor of the shunt capacitor is only seen when the shunt capacitor C3, C6 is enabled and the T circuit is in the low capacitance state. The disclosed examples thus advantageously provide a high capacitance state that correlates with the highest quality factor for the structure. In certain applications, the control circuit 130 is configured to place the capacitor T circuits 121, 122 in the high capacitance state when high gain is desired and this corresponds to the highest quality factor. If lower gain is desired, the control circuit 130 enables shunt capacitor to reduce the capacitance of the T circuit and lower the Q factor of the structure, both of which effects aid in amplifier gain reduction. Moreover, the disclosed examples facilitate stability control by providing the ability to load the quality factor of the neutralization capacitor and reduce instability. In CMOS mm wave radar system applications, neutralized differential amplifiers are commonly designed to operate close to the unilateral gain of the differential pair transistors. In conventional approaches, neutralization capacitance is limited by strong process corner gate to source capacitance Cgd and limits gain performance at nominal/weak corners to maintain amplifier stability. Moreover, conventional designs suffer from thermal variation within a single process corner, e.g., a 6-7 dB spread from −40 C to 125 C. The disclosed examples facilitate robust design for high temperature parts (e.g., 125 C) and allow preconfigured operation for lower temperature rated parts or real time neutralization adjustment during operation to back off capacitance and gain for operation at colder temperatures.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A differential amplifier circuit, comprising:
a differential input, including a first input node, and a second input node;
a differential output, including a first output node, and a second output node;
a differential pair circuit, including a first transistor and a second transistor, to amplify a differential input signal from the differential input, to deliver a differential output signal to the differential output;
a first neutralization circuit, including:
a first impedance element connected between the first input node and a first internal node,
a second impedance element connected between the first internal node and the first output node, and
a third impedance element coupled in series with a third transistor between the first internal node and a reference node;
a second neutralization circuit, including:
a fourth impedance element connected between the second input node and a second internal node,
a fifth impedance element connected between the second internal node and the second output node, and
a sixth impedance element coupled in series with a fourth transistor between the second internal node and the reference node; and
a control circuit coupled to provide a first control signal to a control terminal of the third transistor to control a first neutralization impedance between the first input node and the first output node, the control circuit coupled to provide a second control signal to a control terminal of the fourth transistor to control a second neutralization impedance between the second input node and the second output node.

2. The differential amplifier circuit of claim 1, wherein the differential pair circuit includes:
a first n-channel field effect transistor, including a first gate connected to the first input node, a first drain connected to the second output node, and a first source connected to a common source node; and
a second n-channel field effect transistor, including a second gate connected to the second input node, a second drain connected to the first output node, and a second source connected to the common source node.

3. The differential amplifier circuit of claim 2, wherein the first, second, third, fourth, fifth and sixth impedance elements are capacitors.

4. The differential amplifier circuit of claim 3, wherein the third and sixth impedance elements are MOS capacitors or varactors.

5. The differential amplifier circuit of claim 2, further comprising:
a first bias circuit coupled with the differential pair circuit to control a voltage of the common source node; and
a second bias circuit coupled with the differential pair circuit to control a current of the first drain, and to control a current of the second drain.

6. The differential amplifier circuit of claim 2,
wherein the third transistor is an n-channel field effect transistor, including a third gate connected to the control circuit to receive the first control signal, a third drain connected to the third impedance element, and a third source connected to the reference node; and
wherein the fourth transistor is an n-channel field effect transistor, including a fourth gate connected to the control circuit to receive the second control signal, a fourth drain connected to the sixth impedance element, and a fourth source connected to the reference node.

7. The differential amplifier circuit of claim 1, wherein the control circuit includes a fuse circuit coupled to provide one of the first control signal and the second control signal.

8. The differential amplifier circuit of claim 1, wherein the control circuit includes:
   a fuse circuit coupled to provide a multi-bit digital signal; and
   a digital-to-analog converter circuit, including an output to provide one of the first control signal and the second control signal according to the multi-bit digital signal.

9. The differential amplifier circuit of claim 1, wherein the control circuit includes:
   an analog-to-digital converter circuit, including an input to receive an analog input signal, and an output to provide a multi-bit digital signal according to the analog input signal; and
   a digital-to-analog converter circuit, including an output to provide one of the first control signal and the second control signal according to the multi-bit digital signal.

10. The differential amplifier circuit of claim 1, further comprising a sensor to sense an environmental condition of the differential amplifier circuit, the sensor including an output to provide an analog signal to directly or indirectly set a level of one of the first control signal and the second control signal.

11. The differential amplifier circuit of claim 1, wherein the third impedance element and the fifth impedance element are MOS capacitors or varactors.

12. The differential amplifier circuit of claim 1, wherein the control circuit is configured to provide the first and second control signals in a first state to turn the third and fourth transistors off to set the first and second neutralization impedances to a first impedance value, or in a second state to turn the third and fourth transistors at least partially on to set the first and second neutralization impedances to a second impedance value lower than the first impedance value.

13. A differential amplifier circuit, comprising:
   a differential input, including a first input node, and a second input node;
   a differential output, including a first output node, and a second output node;
   a differential pair circuit, including a first transistor and a second transistor, to amplify a differential input signal from the differential input to deliver a differential output signal to the differential output;
   a first neutralization circuit, including:
      a first impedance element connected between the first input node and a first internal node,
      a second impedance element connected between the first internal node and the first output node, and
      a third impedance element, including a first terminal connected to the first internal node, and a second terminal;
   a second neutralization circuit, including:
      a fourth impedance element connected between the second input node and a second internal node,
      a fifth impedance element connected between the second internal node and the second output node, and
      a sixth impedance element including a first terminal connected to the second internal node, and a second terminal;
   a third transistor connected to the second terminals of the third and sixth impedance elements; and
   a control circuit coupled to provide a control signal to a control terminal of the third transistor to control a first neutralization impedance between the first input node and the first output node, and to control a second neutralization impedance between the second input node and the second output node.

14. The differential amplifier circuit of claim 13,
   wherein the second terminals of the third and sixth impedance elements are connected to one another; and
   wherein the third transistor is an n-channel field effect transistor, including a drain connected to the second terminals of the third and sixth impedance elements, a source connected to a reference node, and a gate control terminal connected to receive the control signal from the control circuit.

15. The differential amplifier circuit of claim 13, wherein the third transistor is an n-channel field effect transistor, including a drain connected to the second terminal of the third impedance element, a source connected to the second terminal of the sixth impedance element, and a gate control terminal connected to receive the control signal from the control circuit.

16. The differential amplifier circuit of claim 13, wherein the differential pair circuit includes:
   a first n-channel field effect transistor, including a first gate connected to the first input node, a first drain connected to the second output node, and a first source connected to a common source node; and
   a second n-channel field effect transistor, including a second gate connected to the second input node, a second drain connected to the first output node, and a second source connected to the common source node.

17. The differential amplifier circuit of claim 13, wherein the third and sixth impedance elements are MOS capacitors or varactors.

18. The differential amplifier circuit of claim 13, wherein the control circuit is configured to provide the control signal in a first state to turn the third transistor off to set the first and second neutralization impedances to a first impedance value, or in a second state to turn the third transistor at least partially on to set the first and second neutralization impedances to a second impedance value lower than the first impedance value.

19. The differential amplifier circuit of claim 13, further comprising a sensor to sense an environmental condition of the differential amplifier circuit, the sensor including an output to provide an analog signal to directly or indirectly set a level of the control signal.

20. A variable neutralization circuit for providing an adjustable neutralization impedance between an input node of a differential amplifier and an output node of the differential amplifier, the variable neutralization circuit comprising:
   a first capacitive element, comprising:
      a first terminal connected to the input node of the differential amplifier; and
      a second terminal connected to a first internal node;
   a second capacitive element, comprising:
      a first terminal connected to the first internal node; and
      a second terminal connected to the output node of the differential amplifier;
   a third capacitive element, comprising:
      a first terminal connected to the first internal node, and
      a second terminal;
   a transistor comprising:
      a drain connected to the second terminal of the third capacitive element;
      a gate, wherein the variable neutralization circuit is free of a connection between the first internal node and the gate of the transistor; and a control circuit coupled to provide a control signal to the gate of the transistor to control the adjustable neutralization impedance between the input node of the differential amplifier and the output node of the differential amplifier.

21. The variable neutralization circuit of claim 20, wherein the third capacitive element is a metal oxide semiconductor (MOS) capacitor or a varactor.

* * * * *